United States Patent [19]
Bae et al.

[11] Patent Number: 5,247,194
[45] Date of Patent: Sep. 21, 1993

[54] THIN FILM TRANSISTOR WITH AN INCREASED SWITCHING RATE

[75] Inventors: Byungseong Bae; Jeongha Sohn, both of Seoul, Rep. of Korea

[73] Assignee: Samsung Electronics Co., Ltd., Kyunggi, Rep. of Korea

[21] Appl. No.: 825,256

[22] Filed: Jan. 24, 1992

[30] Foreign Application Priority Data

May 24, 1991 [KR] Rep. of Korea ............... 91-8487
May 27, 1991 [KR] Rep. of Korea ............... 91-8665

[51] Int. Cl.⁵ .................... H01L 29/04; H01L 29/036
[52] U.S. Cl. ............................ 257/59; 257/72; 359/59
[58] Field of Search ........... 357/2, 4, 23.7; 359/59; 257/59, 72

[56] References Cited

U.S. PATENT DOCUMENTS

| | | | |
|---|---|---|---|
| 4,738,749 | 4/1988 | Maurice et al. | 357/23.7 |
| 4,775,861 | 10/1988 | Saito | 359/59 |
| 4,918,494 | 4/1990 | Koden et al. | 357/23.7 |
| 5,015,597 | 5/1991 | Vinouze et al. | 357/23.7 |
| 5,049,952 | 9/1991 | Choi | 357/23.7 |
| 5,055,899 | 10/1991 | Wakai et al. | 357/23.7 |
| 5,070,379 | 12/1991 | Nomoto et al. | 357/23.7 |

FOREIGN PATENT DOCUMENTS

| | | | |
|---|---|---|---|
| 1-68726 | 3/1989 | Japan | 357/23.7 |
| 2-186325 | 7/1990 | Japan | 359/59 |
| 3-33724 | 2/1991 | Japan | 359/59 |
| 3-72326 | 3/1991 | Japan | 359/59 |

Primary Examiner—Rolf Hille
Assistant Examiner—Steven Loke
Attorney, Agent, or Firm—Watson, Cole, Grindle & Watson

[57] ABSTRACT

A thin film transistor arranged in a matrix array with a strip type gate address line and a source signal line, comprising: an insulating layer formed on the gate address line; a semiconductor layer formed on the insulating layer, which serves as a channel conductive layer; the source signal line formed passing by one side of the channel layer; a first drain electrode arranged in parallel with, and spaced from, said source signal line; and at least one pixel electrode connected to any one side of the drain electrode.

7 Claims, 6 Drawing Sheets

THIN FILM TRANSISTOR WITH AN INCREASED SWITCHING RATE

BACKGROUND OF THE INVENTION

(1) Field of the Invention

The present invention relates to a thin film transistor arranged in a matrix array and, more particularly, to a thin film transistor which ensures an increased switching rate by using a gate line without forming a separate gate electrode, the enhancement of processing efficiency by simplifying the transistor structure, and an improvement in the driving ability in which the portion of the source line corresponding to a channel width of the thin film transistor has a rounded contour thereby increasing the channel width and the on-current characteristic.

(2) Description of the Related Art

A thin film transistor is a semiconductor element used as an electrical switching means for selective driving of pixel electrodes, e.g., in a liquid crystal display device, and is generally formed as an inverse staggered-type, metal oxide semiconductor transistor. A transistor is formed by which a gate electrode is deposited and patterned on a glass substrate, and an insulating layer, an armophous silicon layer for forming a channel, a source electrode connected to a signal line, and a drain electrode are formed thereon. A plurality of such elements is arranged in a matrix array.

As shown in FIG. 1 illustrating gate and source lines and a drain electrode arranged in a matrix array, the gate line 1 and the source line 2 overlap each other, and the drain electrode 3 is arranged to be separated from the source line 2. The insulating layer and a semiconductor layer 6 are interposed between a gate electrode 1' of the gate line and the source or drain electrode 2' or 3.

As shown in the drawing, the source and drain electrodes 2' and 3 are assigned to a region where a transistor is formed, and a signal outputted from the source electrode 2' is transferred to the drain electrode via a channel layer placed underneath the source electrode 2'. These elements arranged in a matrix array are connected to address lines joining the source or gate electrodes, and conventional elements are formed on these strip-like lines. Therefore, when it comes to manufacture of the thin film transistors according to the prior art the areas to which pixel electrodes are connected to one side of the drain electrodes are limited, and the arranged structure of the matrix is complicated. Such a microscopic arrangement has a slim possibility of success, from a technological point of view.

As shown in FIG. 1, the width of the above channel layer is limited by the width of the source/drain electrodes, and the improvement of the channel width is dependent upon the form of electrode patterns. A primary object of the improvement of the channel width is to apply an on-current satisfactory to the pixel electrodes requiring larger driving current. In order to do so, the improvement of widening the gate electrodes is not preferable to increasing the size of the elements or the whole arrangement, and at the same time, the off-current is increased.

Particularly, these elements assigned in a matrix are connected to address lines joining the source/gate electrodes and conventional elements are formed on these strip-like lines. Therefore, when it comes to the manufacture of the thin film transistors, the areas to which pixel electrodes are connected to one side of the drain electrodes are limited, and the arranged structure of the matrix is complicated. Thus, it is difficult to make an embodiment of such a microscopic arrangement.

SUMMARY OF THE INVENTION

An object of the present invention is to provide a structure comprising a plurality of thin film transistors arranged in matrix array of which the manufacturing steps are easy to be carried out and the on-currents are more improved, and to further provide a thin film transistor assigned in a matrix array to be formed directly on an address line without forming a gate electrode for the formation of a transistor on the gate address line.

Another object of the present invention is to provide a thin film transistor having an improved driving ability in which the portion of the source line corresponding to a channel width of the thin film transistor has a rounded contour thereby increasing the channel width and the on-current characteristic.

Sill another object of the present invention is to provide a thin film transistor wherein the pixel electrodes can be variously arranged and a plurality of pixel electrodes be driven with at least one transistor.

According to a primary feature of the present invention, a thin film transistor assigned in a matrix array including a strip-like gate address line and a source signal line comprises:

an insulating layer formed on the gate address line;

a semiconductor layer formed on the insulating layer, which serves as a channel conductive layer;

the source signal line formed passing by one side of the channel layer;

a drain electrode arranged in parallel with, and maintaining spacing from, the source signal line; and at least one pixel electrode connected to any one side of the drain electrode.

According to another feature of the present invention, a thin film transistor assigned in a matrix array including a strip-like gate address line and a source signal line comprises:

an insulating layer formed on the gate address line;

a semiconductor layer formed on the insulating layer, which serves as a channel conductive layer;

the source signal line whose part corresponding to the channel width of the thin film transistor has a rounded contour and a drain electrode arranged in parallel with, and maintaining spacing from, the source signal line.

DESCRIPTION OF THE PREFERRED EMBODIMENTS

Figure 2:
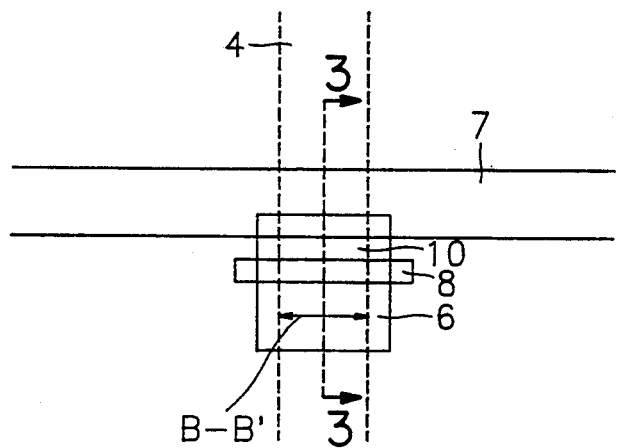
FIG. 2 is a schematic plan view of a first preferred embodiment of a thin film transistor in a matrix according to the present invention.
Figure 3:
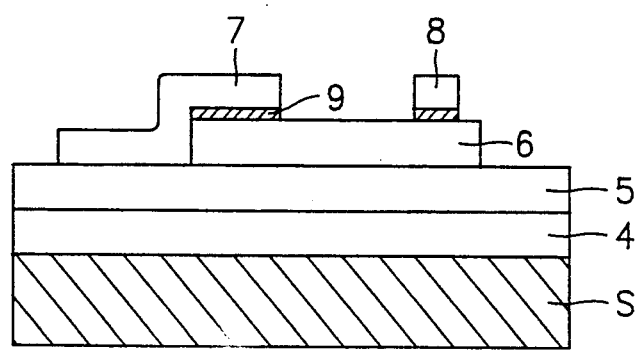
FIG. 3 is a sectional view as taken along lines A-A' of FIG. 2.

FIG. 2 is a schematic plan view of a first preferred embodiment of a thin film transistor in a matrix array according to the invention with the thin film transistor formed on a gate address line 4. As shown in FIG. 3, a gate electrode for forming a transistor on the gate address line 4 is not necessary.

An insulating layer 5 for electrical isolation between electrodes is formed on this line of the strip-type formed on a substrate. A conductive layer for forming a channel, e.g., a semiconductor layer 6 made of amorphous silicon is then formed thereon. Successively, a source line 7, a signal line, is patterned, and a drain electrode 8 is formed spaced from the source line 7. In order to simplify manufacturing steps, this drain electrode is placed in parallel with, and spaced from, the source line 7, and has a stick-like configuration.

Figure 1:
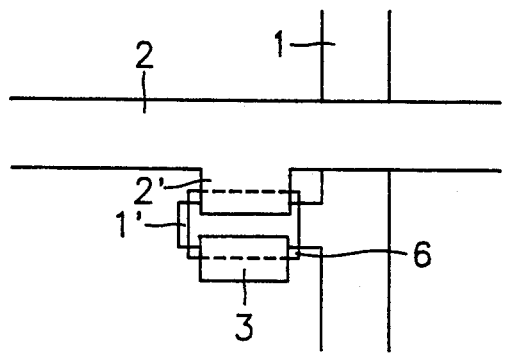
FIG. 1 is a schematic view showing the arrangement of gate and source lines and a drain electrode in a conventional matrix array.

An ohmic layer 9 for ohmic-contact between metal electrode and semiconductor layer 6, is shown not in FIG. 2 but is shown in FIG. 3. As described above, a construction of the present invention is to form a thin film transistor, a switching element, on the gate address line 4, that is, to use the gate line as a gate electrode thereby obtaining advantages of the simplification of structure and increase in the switching rate. Especially, if the gate electrode 1' is not in the gate line as shown in FIG. 1, the gate electrode is partially anodized, and has an advantageous yield aspect.

In the preferred embodiment of the present invention, if a voltage is applied to the gate line like in a typical transistor, a signal voltage from the signal line is transferred to the drain electrode, and then transferred to a transparent pixel electrode connected to the drain electrode. As a voltage is applied to a liquid crystal layer which is to be laid on the pixel electrode, the liquid crystal layer is activated.

Hence in conjunction with the foregoing description several preferred embodiments are described hereinafter, and various arrangements of ITO electrodes are available.

Figure 4:
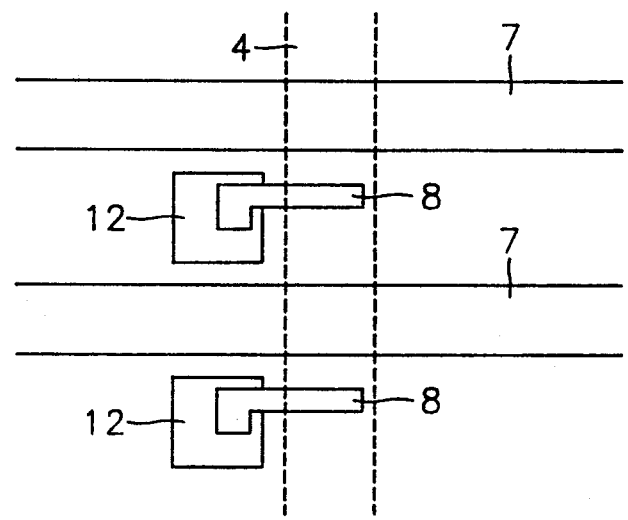
FIGS. 4-6 respectively show second, third and fourth preferred embodiments of the present invention.

FIG. 4 shows a second preferred embodiment of the thin film transistor according to the present invention. In a liquid crystal display device, a pixel is constructed by using a thin film transistor as a switching element, and when the pixel electrode is driven by the thin film transistor according to the present invention, the ITO electrodes 12 are arranged on one side of the drain electrodes 8, as shown in FIG. 4. As shown in that FIG. 4, the other sides of the drain electrodes are placed within the gate line 4, which is not limited thereto. In the drawing, there are two parallel lines, and a whole pixel is constructed by such an arrangement.

Figure 5:
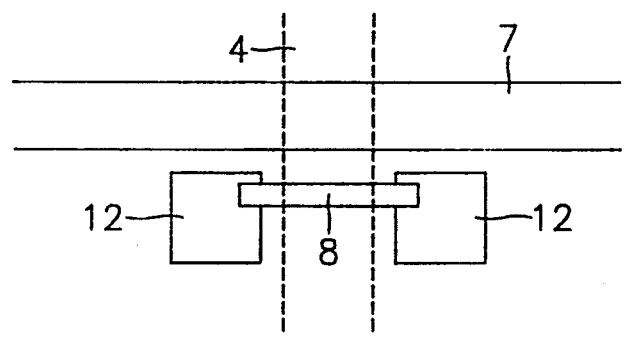

FIG. 5 shows two pixel electrodes arranged on both sides of the drain electrode, as a third embodiment of the present invention, which is an example of driving two pixel by one transistor. The drain electrode 8 is placed in parallel with the source line, maintaining spacing therefrom. Such a simplified structure allows manufacturing steps to be easily carried out.

Figure 6:
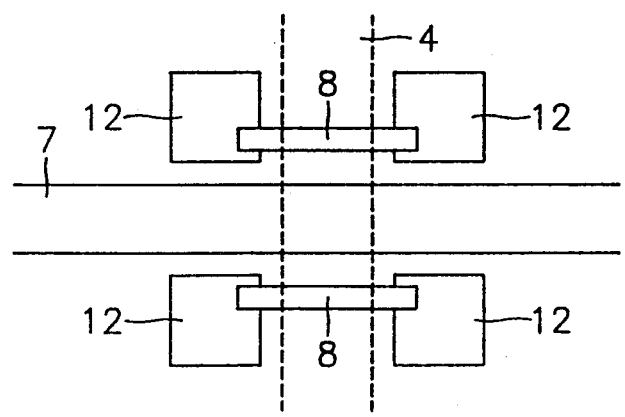

FIG. 6 shows fourth embodiment of the present invention, and, as to one transistor, a pair of the drain electrodes 8 is placed on both sides of the source line 7, and four pixel electrodes 12 are assigned to each drain electrode 8.

Like the above embodiments, the present invention enables various arrangements of pixel elements and easier performance of manufacturing steps. Additionally, the embodiment is just an example, and various modifications are available, as circumstances require.

By assigning a thin film transistor in a matrix according to the present invention, the gate line is used as a gate electrode thereby increasing the switching rate and processing efficiency according to the simplification of the structure.

Figure 7A:
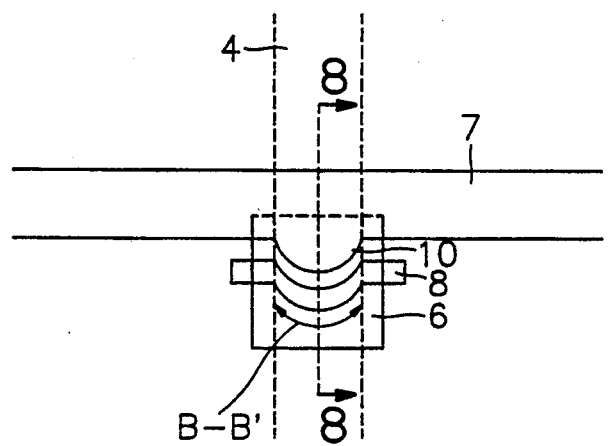
FIGS. 7A and 7B are respectively a schematic plan view and a perspective view of a fifth embodiment according to the present invention.
Figure 7B:
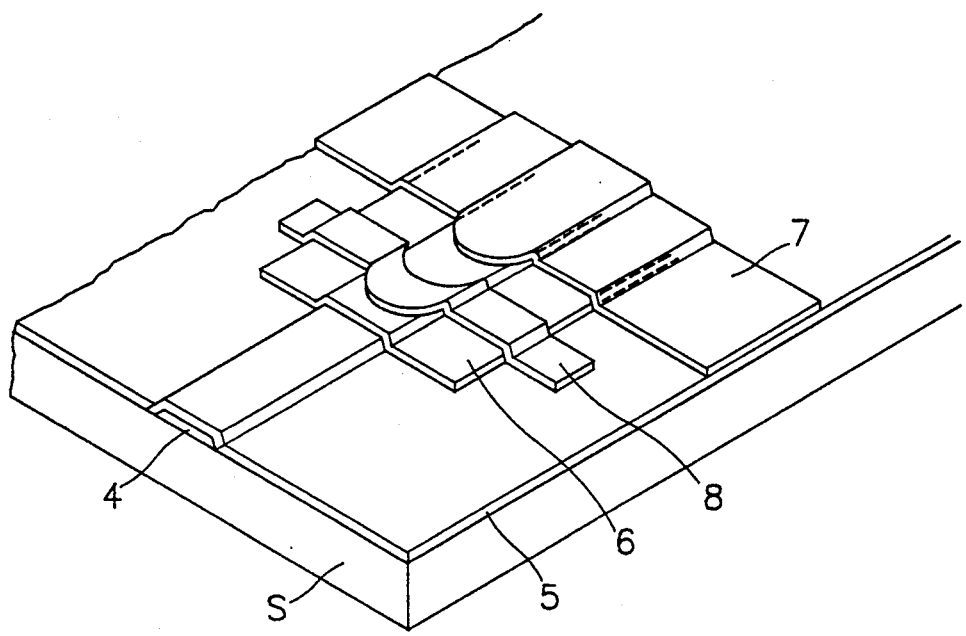

FIG. 7A is a schematic plan view of a fifth embodiment of according to the present invention, and FIG. 7B is a perspective view for the enhancement of the understanding of the structure of this embodiment.

As shown in FIG. 7A, the thin film transistor of the present invention is formed on the gate address line 4. A gate electrode for forming a thin film transistor on the gate address line 4 is not necessary, as mentioned above.

The insulating layer 5 for electrical isolation between the electrodes is formed on the gate address line 4 of strip type, which is more clearly understood from FIG. 7B. A conductive layer for forming a channel, e.g., the semiconductor layer 6, made of amorphous silicon, is formed thereon. Successively, a signal line, the source line 7 is patterned and the drain electrode 8 is formed spaced therefrom.

Figure 8:
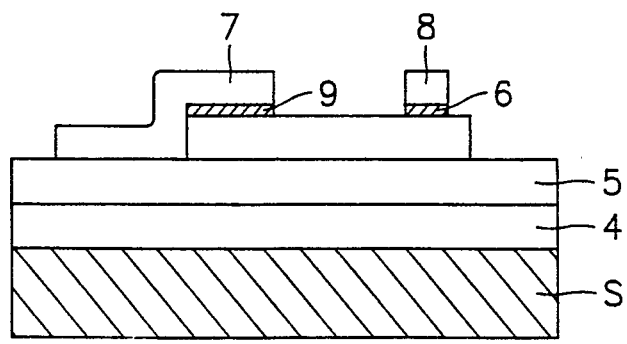
FIG. 8 is a sectional view as taken along lines A-A' of FIG. 7A.

The ohmic layer 9 for enabling ohmic contact between the metal electrode and the semiconductor layer is not shown in FIGS. 7A and 7B but is illustrated in FIG. 8.

As discussed above, when forming the thin film transistor, a switching element of the present invention, on the gate address line 4, the gate line is used as a gate electrode without forming an additional gate electrode, and by simplifying the structure in such a manner the switching rate is increased.

In particular, if the gate electrode is not formed on the gate line as shown in the FIG. 1, with respect to the yield, it is advantageous to apply partial-anodization of the gate electrode to the present invention. However, under such a construction, there may be a reduction of channel width which results in deterioration of the on-current. Therefore, as shown in FIG. 7A, the portion of the source line 7, according to the present invention, corresponding to the channel width of the thin film transistor B-B' has a rounded configuration. The channel width B-B' is defined according to the rounded configuration 10 of the source electrode, and increases the on-current. The size and shape of the above rounded configuration can be variously made according to any design, that is, in consideration of on-currents, the applied embodiments, etc. The contour of the drain electrode is formed to be curved corresponding to the conforming rounded portion of the source electrode.

Figure 9:
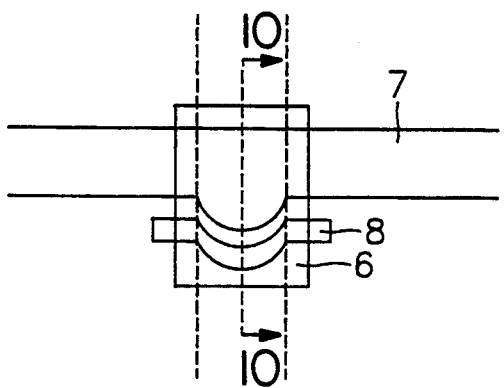
FIG. 9 is a plan view of a sixth embodiment according to the present invention.
Figure 10:
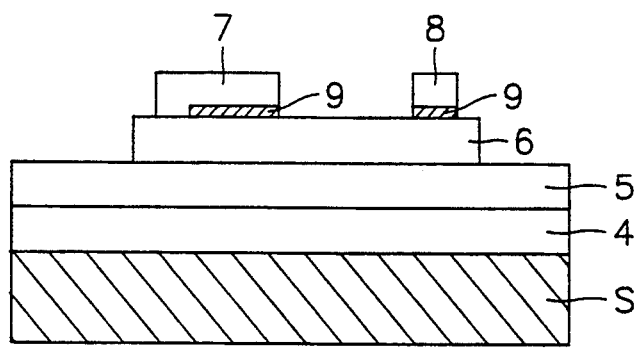
FIG. 10 is sectional view as taken along lines A-A' of FIG. 9.

As shown in FIG. 9, illustrating a sixth embodiment according to the present invention, the source line 7 is formed within the semiconductor layer 6, and FIG. 10 shows a sectional view as taken along lines A-A' of FIG. 9.

In the preferred embodiment of the present invention, if a voltage is applied to the gate line like a typical transistor, a signal voltage from the signal line is transferred to the drain electrode, and then transferred to a transparent pixel electrode connected to the drain electrode. As a voltage is applied to a liquid crystal layer which is to be laid over the pixel electrode, the liquid crystal layer is activated.

Hence with the foregoing explanation in mind, several preferred embodiments are described hereinafter and various arrangements of ITO electrodes are available.

Figure 11:
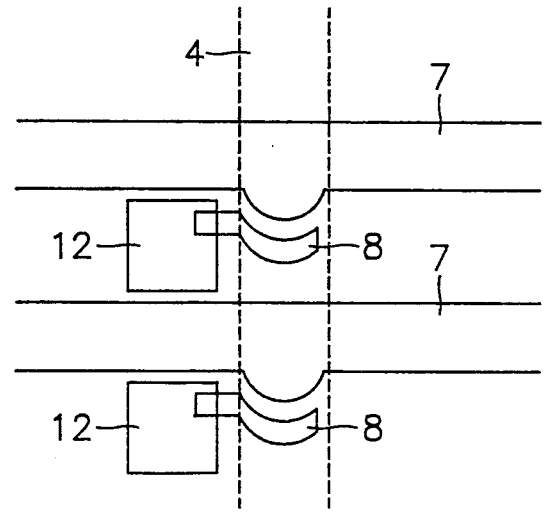
FIGS. 11 to 14 respectively show seventh, eighth, ninth and tenth embodiments of the present invention.

FIG. 11 shows a seventh embodiment of the present invention, wherein in a liquid display device, a pixel is constructed using a thin film transistor as a switching element, and when the pixel electrode is driven by the thin film transistor according to the present invention, the ITO electrodes 12 are arranged on one side of the drain electrodes 8, as shown in FIG. 11. According to FIG. 11, the other sides of the drain electrodes are placed within the gate line 4, which is not limited thereto In the drawing, there are two parallel lines 7 and 7' and the whole pixel is constructed in such a manner.

Figure 12:
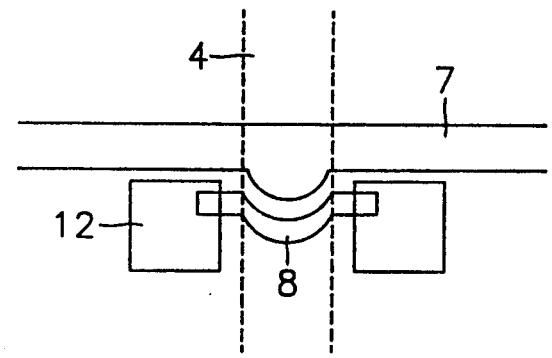

FIG. 12 shows an eighth embodiment of arranging two pixel elements on both sides of the drain electrode according to the present invention, which is an example of driving two pixels by one transistor, and the "on" current capable of driving two pixel elements is provided by the increase of the channel width in the thin film transistor of the present invention. Additionally, two pixels are driven by one transistor, whereby the size of the pixel can be made half the regular size thereof. Accordingly, the size of the pixel driven by one transistor is the same.

Figure 13:
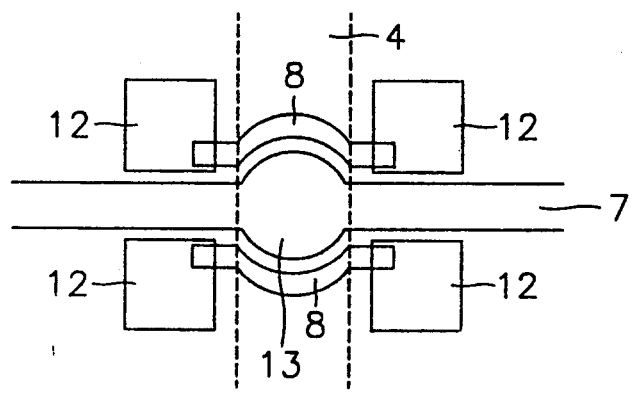
Figure 14:
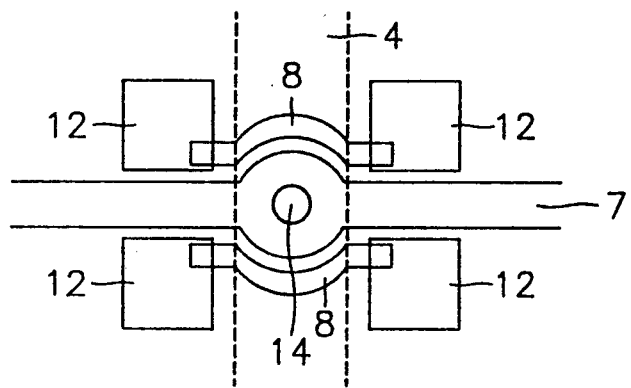

FIGS. 13 and 14 show respective ninth and tenth embodiments of the present invention, wherein a transistor, a pair of drain electrodes 8 are assigned to both sides of the source line 7, and four pixel electrodes 12 are respectively assigned to the drain electrodes. At this point, the source line has a rounded configuration 13, which results in an advantage of reducing resistance, according to increasing somewhat the size of the signal line. Also, with reference to FIG. 14, the inside 14 of the rounded configuration 13 is etched to form a concentric circle, which ensures a decrease in the size of the overlapped portion between the gate line and the signal line and which construction precludes a short between the electrodes by a pinhole. Additionally, there are four pixel electrodes, and the pixel electrodes can be assigned to the drain electrodes, with its size being reduced by ¼. FIG. 14 shows the miniaturized size of the overlapped portion between the gate line 4 and the source line 7.

Figure 15:
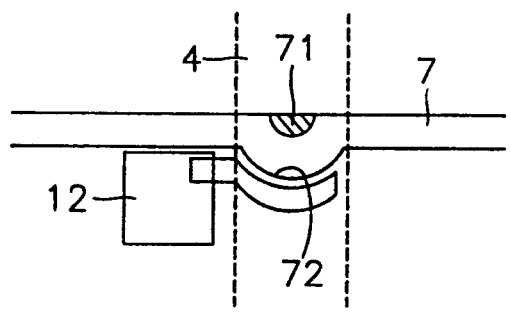
FIGS. 15 and 16 respectively show eleventh and twelfth embodiments as to a source of a transistor according to the present invention.
Figure 16:
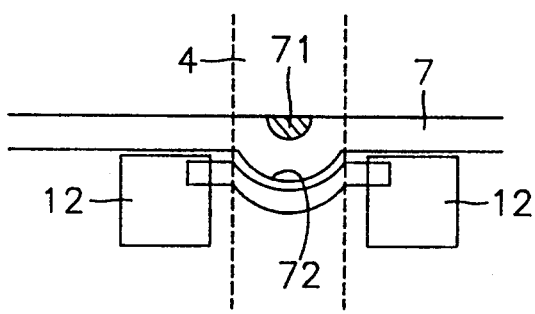

In FIGS. 15 and 16, a part of the source line 7 is rounded, and two sides of the source line 71 and 72 are rounded according to the source line, thereby minimizing the overlapped portion by removing the hatched portion shown in the drawing. FIGS. 15 and 16 correspond to FIGS. 11 and 12, respectively.

Figure 17:
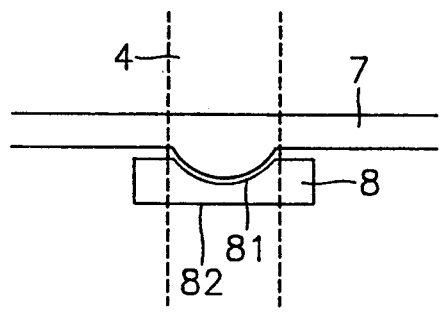
FIG. 17 shows the other embodiment as a drain electrode of a transistor according to the present invention.

In all of the several preferred embodiments as discussed above, the opposite side 82 of a rounded portion 81 of the drain electrode 8, in the same manner as the rounded source line 7, is parallel to the source line 7 in the lengthwise direction, as shown in FIG. 17. Thus, the manufacturing stages can be easily carried out by extending the size of the drain electrode and simplifying the contour thereof.

According to the thin film transistor of the present invention, the switching rate is increased by using the gate line as a gate electrode, and owing to the simplification of the structure, the processing efficiency is enhanced. Additionally, the source and drain electrodes have rounded contours, and according to the increase in the channel width, the driving ability of a plurality of pixels is provided.

Modifications and alterations of the foregoing embodiments will be readily apparent to those skilled in the thin film transistor art; however, the scope of the subject invention is not to be limited to the specific structures defined herein, but by the limitations of the claims appended hereto and the equivalents to be accorded thereto in accordance with the foregoing description and the prior art.

What is claimed is:

1. A thin film transistor arranged in a matrix array having a strip type gate address line and a source signal line, comprising:

an insulating layer formed on said gate address line;

a semiconductor layer formed on said insulating layer, which serves as a channel conductive layer;

said source signal line including a part corresponding to a channel width of the thin film transistor and having a rounded contour;

said gate address line having a rounded contour portion; and a drain electrode arranged in parallel with, and spaced from, said source signal line and having a rounded contour confronting the rounded contour of said source signal line and said gate address line, said rounded contour of said gate address line, said source signal line and said drain electrode being of substantially the same length.

2. A thin film transistor according to claim 1, wherein one side of said source signal line is convex facing towards the drain electrode.

3. A thin film transistor according to claim 2, wherein the inside of the rounded contour of said source signal line is partially etched.

4. A thin film transistor according to claim 1, wherein one side of said drain electrode confronts the rounded contour of the source signal line.

5. A thin film transistor according to claim 4, wherein the opposite side of the rounded contour of the drain electrode is parallel to the source signal line in the lengthwise direction of both said drain electrode and said source signal line.

6. A thin film transistor according to claim 1, wherein each side of the source signal line has the same contour as each other.

7. A thin film transistor according to claim 1, wherein the source signal line is formed to be placed on or within the semiconductor layer.

* * * * *